Dec. 22, 1970 R. F. GETCHELL 3,549,980

LOW-DISTORTION FREQUENCY DOUBLER

Filed April 7, 1969

INVENTOR.
RALPH F. GETCHELL

BY Harry M. Saragovitz
Edward J. Kelly
Herbert Berl AGENT
Charles F. Gunderson

ATTORNEYS 3,549,980

LOW-DISTORTION FREQUENCY DOUBLER

Ralph F. Getchell, Spring Lake, N.J., assignor to the United States of America as represented by the Secretary of the Army Filed Apr. 7, 1969, Ser. No. 814,004
Int. Cl. H02m 5/30
U.S. Cl. 321—69 6 Claims

ABSTRACT OF THE DISCLOSURE

This invention relates to frequency doublers and in particularly to low distortion and high efficiency frequency doubling systems. This disclosure describes the connection of a pair of complimentary-symmetry transsistors with a common input at a given frequency to produce a common output at twice the given input frequency.

The invention described herein may be manufactured, used, and licensed by or for the Government for governmental purposes without the payment to me of any royalty thereon.

BACKGROUND OF THE INVENTION

There are very many frequency doubling circuits available but also all of these frequency doubling circuits use an input signal with a very high second harmonic distortion, or they distort an input signal to achieve a very high second harmonic distortion, and apply the distorted signal to a circuit, with or without associated amplifying equipment, tuned to a multiple of the input frequency. These frequency doublers are limited in efficiency because there is a limit to the amount of second harmonic distortion that can be found in a waveform of a given frequency. There is also considerable distortion in the output of these frequency doublers since these systems, by the very nature of the method of obtaining the harmonics, introduce a high percentage of harmonics other than the second.

The methods for removing and isolating the second harmonic components of a fundamental frequency require selective filters or highly resonant circuits tuned to the necessary frequency. These filters or resonant circuits must all be returned to accommodate the second harmonic of any new input frequency.

There are also very many push-pull circuits in the field of electronic circuitry including many with complimentary-symmetry transistors. However, these are all designed for entirely different functions and none of them has the specific circuitry or teaches the special biasing level necessary to produce frequency doubling of the high efficiency and the very low distortion that is possible in the circuit to be described here.

It is therefore an object of this invention to provide a relatively-high output, low distortion, wide range, simple and efficient frequency doubler.

SUMMARY OF THE INVENTION

These and other objects are accomplished by connecting complimentary symmetry transistors in push-pull across a coil that may be part of a circuit tuned to twice the frequency of the input. The input is fed to both transistors simultaneously but both transistors are biased to the point where each conducts only on one, alternate half cycle. Since complimentary symmetry transistors are used, the reverse voltage on one transistor provides exactly the same effect on the output as the unreversed voltage on the other transistor. The output has an effectively full cycle wave on each half cycle of the input to provide a strong, low-distortion, output signal at double the input frequency.

This invention will be better understood and by reference to the following specification and drawings:

DETAILED DESCRIPTION OF THE PREFERRED EMBODIMENT

Figure 1:
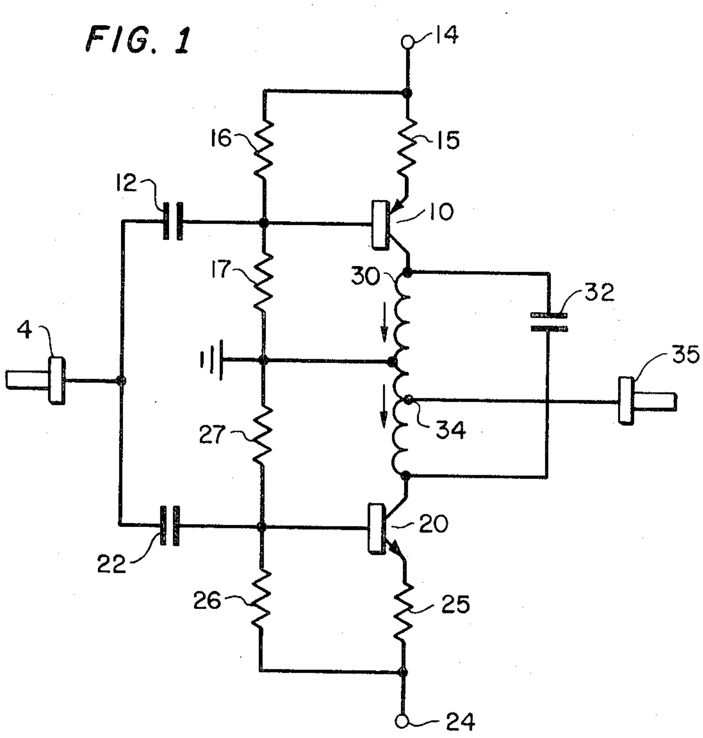
FIG. 1 shows a circuit diagram of the invention.

Referring now particularly to FIG. 1, a pair of transistors 10 and 20 are connected in push-pull across a coil 30 which is connected in parallel with a capacitor 32 to form a resonant circuit which is tuned to the output frequency. An output terminal 35 is connected to point 34, on the coil 30. A signal at input terminal 4 is applied, simultaneously, through capacitors 12 and 22 to the base electrodes of the transistors 10 and 20 respectively. A source of voltage 14, that is positive with respect to ground supplies transistor 10 through a stabilizing and biasing resistor 15. The same voltage is applied across voltage dividing resistors 16 and 17 to bias the base electrode of the transistor 10 to the correct voltage. A source of voltage 24, that is negative with respect to ground is connected through a stabilizing and biasing resistor 25 to the transistor 20. Voltage from the same source is applied through the voltage dividing resistors 26 and 27 to bias the base electrode of the transistor 20 to the correct value. Both transistors 10 and 20 are biased to cut-off with no signal at the input terminal 4.

Figure 2:
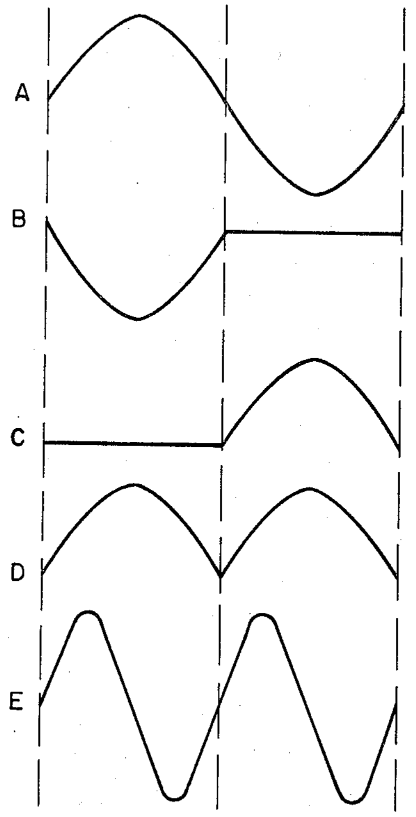
FIG. 2 shows a series of waveforms illustrating the frequency doubling function of the circuit.

The operation of this invention will be better understood by referring to FIG. 2. In FIG. 2, curve A shows a typical sine wave curve representing the input signal voltage applied at the input terminal 4. This signal is applied simultaneously through condensers 12 and 22 to the base-electrode inputs of the transistors 10 and 20 respectively. As the input signal swings from positive to negative it either causes the transistors to conduct or further cuts them off. Since these are complimentary symmetry transistors, one of the transistors is made to conduct while the other transistor is further cut off on one half cycle of the input signal and vice versa on the second half cycle.

For example, curve B shows the negative increase in the current in transistor 20 when the incoming signal goes positive, and the zero current condition when the incoming signal goes negative. Curve C of FIG. 2, on the other hand, shows that transistor 10 does not conduct when the input signal goes positive but has a positive increase in current when the input signal goes negative.

Since the transistors are of complimentary symmetry and are powered by opposite voltage with respect to ground through separate halves of the output coil, the coil has both an increase and a decrease in current in one half of the coil during the same one half cycle of the input signal through the action of the first transistor, and again, both an increase and a decrease in current in the other half of the coil during the second half of the cycle through the action of the second transistor. The positive half cycle causes the same effect in the polarity of voltage swing in one half of the coil that the negative half cycle causes in the other. This produces a change in current in the coil such as is seen in D of FIG. 2. This is indicated by the direction of the arrows alongside the halves of the output coil. The resulting signal has twice the frequency of the incoming signal in A of FIG. 2 and produces a signal voltage at the tap 34, and the output terminal 35, such as is seen in E of FIG. 2. If the output coil 30 and the capacitor 32 are tuned to twice the frequency of the input signal, this output frequency will be filtered and undesirable components of the output frequency will be rejected.

For the most effective operation of this circuit, the bias to each transistor should be as close to cutoff as possible and this is acheived by control of the ratio of the resistors 16 and 17 for the transistor 10, or 26 and 27 for the transistor 20. Variation in the exact point of cutoff will vary the efficiency of the frequency doubling or the smoothness of transition from one transistor to the other, in a predictable manner. This will also have an influence on the relative distortion. Once the bias is adjusted for given circuit parameters it would presumably remain constant. However, it is obvious that variable resistors can be supplied in one or both the arms of the voltage dividers to provide variable control of the bias for fine adjustment. The biases can be controlled individually, or variable resistors in both voltage dividers can be ganged together to control the biases of both transistors simultaneously. Resistors 17 and 27 also may be replaced by a potentiometer having the moveable arm grounded and this potentiometer can be used to balance the operation of the two transistors.

The tuned circuit comprising the coil 30 and capacitor 32 will, normally, be tuned to exactly twice the frequency of the incoming signal, and if the incoming signal is varied either the inductor or the capacitor can be varied to retune to the correct, new frequency. Smaller variations of the input frequency can be accommodated by lowering the Q of the tuned circuit 30 and 32 to cover a wider band of frequencies without requiring retuning. The Q of the circuit can be lowered in a well known manner by adding resistance in series or in parallel with the circuit elements.

However, this circuit inherently produces a doubled frequency with little or none of the fundamental input frequency components and relatively little of the higher harmonic components, even without filtering, and, in cases where this comparatively-low distortion can be tolerated, this circuit can be used without the tuning capacitor 32. This will provide wide-band operation with only a slight degradation of performance. For example, a bandwidth of from 5 to 500 cycles can be obtained with a single coil. Over such a wide band of frequencies a variation in the voltage of the output signal is to be expected, but this can be corrected by suitable frequency compensation. In any case, in addition to the doubled frequency, a votlage gain of from 20 to 40 db is also provided by this circuit.

The input signal must be large enough to clearly switch the transistors from an on to an off state and to provide the best ratio between the conducting half cycle and the nonconducting half cycle. The input signal should also be large enough to take full advantage of the gain and power characteristics of the transistor, up to the point where objectionable distortion might be added by the transistor itself.

In a typical circuit as shown in FIG. 1, with an input frequency of 80 kc. and an output frequency of 160 kc. the capacitors 12 and 22 are .47 microfarads. The resistors 16 and 26 are 10,000 ohms, the resistors 17 and 27 are 100,000 ohms, the resistors 15 and 25 are 560 ohms, the transistor 10 is a PNP type 2N2905, the transistor 20 is an NPN type 2N2219, the push-pull output coil 30 should be of the correct impedance to match the transistors and the capacitor 32 should be of the correct value to provide the desired output frequency in combination with the coil 30. The voltage at 14 is +6 volts and the voltage at 24 is −6 volts.

The output is taken from a tap 34 along the coil 30. The tap is shown on one half of the center-tapped coil although it is obvious that the tap can be on either side, and the number of turns away from the ground potential on either side will establish the output impedance and voltage, in a well known manner.

What is claimed is:

1. A frequency doubling circuit comprising an output coil with a grounded center-tap; a PNP transistor having emitter, collector, and base electrodes; a source of positive voltage with respect to ground; means for connecting said source of positive voltage in series with said emitter and collector electrodes of said PNP transistor to one side of said output coil; an NPN transistor having emitter, collector, and base electrodes; a source of negative voltage with respect to ground; means for connecting said source of negative voltage in series with said emitter and collector electrodes of said NPN transistor to the other side of said output coil; means for biasing said base electrode of said PNP transistor to be cut off when no signal is applied; means for biasing said base electrode of said NPN transistor to be cut off when no signal is applied; an input terminal; means for connecting said input terminal to said base electrodes of both of said transistors; an output terminal; and means for connecting said output terminal to said output coil, said PNP transistor conducting only on one half cycle of an input signal and said NPN transistor conducting only on the other half cycle of an input signal.

2. In a frequency doubler as in claim 1, a capacitor connected across said coil to form a resonant circuit tuned to twice the frequency of an input signal.

3. In a frequency doubler as in claim 1, said means for biasing said base electrode of said PNP transistor comprising a voltage dividing network connected across said source of positive voltage, and said means for biasing said base electrode of said NPN transistor comprising a voltage dividing network connected across said source of negative voltage.

4. In a frequency doubling circuit as in claim 1, said means for connecting said input terminal to said base electrodes of both of said transistors comprising a first coupling capacitor connected between said input terminal and said base electrode of said PNP transistor; and a second coupling capacitor connected between said input terminal and said base electrode of said NPN transistor.

5. In a frequency doubling circuit as in claim 1, said means for connecting said output terminal to said output coil comprising an off-center tap on said output coil, and means for connecting said output terminal to said off-center tap.

6. In a frequency doubling circuit as in claim 1 said means for connecting said source of positive voltage in series with said emitter and collector electrodes of said PNP transistor to one side of said output coil comprising a first current-limiting resistor connected between said source of positive voltage and said emitter electrode of said PNP transistor; and said means for connecting said source of negative voltage in series with said emitter and collector electrodes of said NPN transistor to the other side of said output coil comprising a second current-limiting resistor connected between said source of negative voltage and said emitter electrode of said NPN transistor.

References Cited

UNITED STATES PATENTS

| | | | |
|---|---|---|---|
| 3,030,566 | 4/1962 | Collins | 321—69 |
| 3,044,004 | 7/1962 | Sicario | 321—69X |
| 3,161,816 | 12/1964 | Holcomb | 321—69 |
| 3,227,955 | 1/1966 | Yasuda et al. | |
| 3,261,991 | 7/1966 | Lash | 307—271X |
| 3,419,787 | 12/1968 | Baehre | 307—288X |
| 3,433,978 | 3/1969 | Bongenaar et al. | 307—288X |
| 3,440,448 | 4/1969 | Dudley | 307—271 |
| 3,444,393 | 5/1969 | Sassler | 307—313X |
| 3,492,496 | 1/1970 | Callan | 307—288X |

WILLIAM M. SHOOP, Jr., Primary Examiner

U.S. Cl. X.R.

307—288, 313